(12) United States Patent
Kurosawa

(10) Patent No.: US 7,365,429 B2
(45) Date of Patent: Apr. 29, 2008

(54) SEMICONDUCTOR DEVICE AND METHOD FOR MANUFACTURING THE SAME

(75) Inventor: Yasunori Kurosawa, Nagano (JP)

(73) Assignee: Seiko Epson Corporation (JP)

( * ) Notice: Subject to any disclaimer, the term of this patent is extended or adjusted under 35 U.S.C. 154(b) by 135 days.

(21) Appl. No.: 11/197,338

(22) Filed: Aug. 4, 2005

(65) Prior Publication Data

US 2006/0049518 A1    Mar. 9, 2006

(30) Foreign Application Priority Data

Sep. 3, 2004    (JP) .............................. 2004-257331

(51) Int. Cl.
  *H01L 23/48*    (2006.01)
(52) U.S. Cl. ...................... 257/734; 257/737; 257/779; 257/E23.001; 438/106
(58) Field of Classification Search ................ 257/734, 257/669, 737, 772, 779, 780, 784, 782, E23.015, 257/E23.02, E23.023, E23.079; 438/612, 438/106, 107, 108
  See application file for complete search history.

(56) References Cited

U.S. PATENT DOCUMENTS

| | | | |
|---|---|---|---|
| 6,323,542 B1 * | 11/2001 | Hashimoto | .................. 257/669 |
| 6,894,394 B2 | 5/2005 | Hanaoka | |
| 6,927,489 B1 | 8/2005 | Yaguchi et al. | |
| 6,969,910 B2 | 11/2005 | Chinda | |
| 2004/0245621 A1 | 12/2004 | Hanaoka | |
| 2005/0012209 A1 | 1/2005 | Kurosawa | |

FOREIGN PATENT DOCUMENTS

| | | |
|---|---|---|
| JP | 2000-269371 | 9/2000 |
| JP | 2001-077237 | 3/2001 |
| JP | 2004-134480 | 4/2004 |
| JP | 2004-140115 | 5/2004 |
| JP | 2004-140116 | 5/2004 |
| JP | 2004-153230 | 5/2004 |
| JP | 2004-349630 | 12/2004 |

OTHER PUBLICATIONS

Examination result issued in corresponding Japanese application.

* cited by examiner

*Primary Examiner*—Howard Weiss
*Assistant Examiner*—(Vikki) Hoa B Trinh
(74) *Attorney, Agent, or Firm*—Harness, Dickey & Pierce, P.L.C.

(57) ABSTRACT

A semiconductor device, comprising: a semiconductor substrate in which an integrated circuit is formed, the semiconductor substrate having an electrode electrically connected to the integrated circuit; a resin layer formed on a face in which the electrode of the semiconductor substrate is formed, as to avoid the electrode; a wiring formed as to have a protruding portion projecting upwards on the resin layer, the wiring being electrically connected to the electrode; and a solder formed on the protruding portion of the wiring, wherein the upper face portion of the protruding portion is melt-eroded by the solder and the material of the protruding portion.

4 Claims, 2 Drawing Sheets

SEMICONDUCTOR DEVICE AND METHOD FOR MANUFACTURING THE SAME

RELATED APPLICATIONS

This application claims priority to Japanese Patent Application No. 2004-257331 filed Sep. 3, 2004 which is hereby expressly incorporated by reference herein in its entirety.

BACKGROUND OF THE INVENTION

1. Technical Field

The present invention relates to semiconductor devices and a method of manufacturing the same.

As the portable apparatus is being miniaturized, the reduction in size of semiconductor devices to be mounted in portable apparatus is requested. In order to respond to this request, semiconductor devices, such as a Chip Size Package (CSP) having almost the same outline dimension as that of the semiconductor chips, has been developed. Moreover, in recent years, a Wafer level Chip Size Package (WCSP) technique, in which processes through packaging are carried out in the state of a semiconductor wafer and subsequently a dicing process is carried out so that each semiconductor device is manufactured, is widely known. As for the package manufactured with this method, the structure differs from that of the conventional package because the outside dimension is the semiconductor chip size, however, the reliability equal to or beyond that of the conventional package is requested. Japanese Unexamined Patent Publication No. 2001-77237 is an example of the related art.

Generally, in arranging solder on metal wiring and melting the solder, the junction between the solder and the metal wiring is melt-eroded by the solder and the metal of the metal wiring.

SUMMARY

An advantage of the invention is to provide semiconductor devices whose reliability in the electrical coupling is improved and a method of manufacturing the same.

(1) According to a first aspect of the invention, a semiconductor device includes: a semiconductor substrate in which an integrated circuit is formed, the semiconductor substrate having an electrode electrically connected to the integrated circuit; a resin layer formed on a face in which the electrode of the semiconductor substrate is formed, as to avoid the electrode; a wiring formed as to have a protruding portion projecting upwards on the resin layer, the wiring being electrically connected to the electrode; and a solder formed on the protruding portion of the wiring, wherein the upper face portion of the protruding portion is melt-eroded by the solder and the material of the protruding portion. According to the invention, since the thickness of the protruding portion in a land of the wiring is made thicker than the thickness of other than the protruding portion in the land of the wiring, it is possible to reduce disconnection of the wiring significantly even if a stress concentrates on the melt-eroded portion, and thus semiconductor devices whose reliability in the electrical coupling is improved can be provided.

(2) It is preferable that the semiconductor device further includes a solder-resist layer formed as to cover a part of the wiring.

(3) It is preferable that in the semiconductor device the solder-resist layer be not put on the edge of the protruding portion.

(4) According to a second aspect of the invention, a method for manufacturing semiconductor devices includes the steps of forming a resin layer on a face in which an electrode is formed, the electrode being electrically connected to the integrated circuit of a semiconductor substrate having an integrated circuit, as to avoid the electrode; forming a wiring having a protruding portion projecting upwards on the resin layer, the wiring being electrically connected to the electrode; forming a solder-resist layer as to cover at least a part of the wiring and as not to be put on the edge of the protruding portion; and thereafter forming a solder on the protruding portion as to be supported by the resin layer. According to the invention, since the thickness of the protruding portion in a land of the wiring is made thicker than the thickness of other than the protruding portion in the land of the wiring, it is possible to reduce disconnection of the wiring significantly even if a stress concentrates on the melt-eroded portion, and thus semiconductor devices whose reliability in the electrical connection is improved can be provided.

BRIEF DESCRIPTION OF THE DRAWINGS

The invention will be described with reference to the accompanying drawings, wherein like numbers reference like elements, and wherein.

DESCRIPTION OF THE EMBODIMENT

Hereinafter, an embodiment of the invention will be described with reference to the accompanying drawings.

Figure 1:
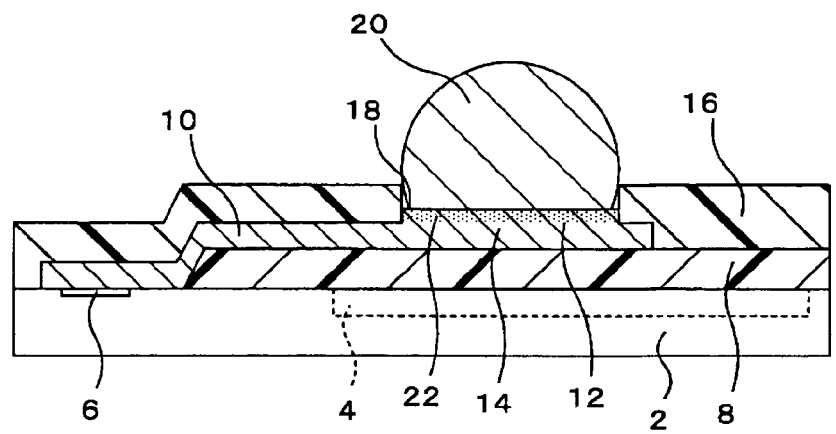
FIG. 1 is a sectional view of a semiconductor device concerning an embodiment of the invention.

FIG. 1 is a sectional view of a semiconductor device concerning an embodiment of the invention. The semiconductor device concerning the embodiment has a semiconductor substrate 2. The semiconductor substrate 2 may be a semiconductor chip or may be a semiconductor wafer. One or plurality of integrated circuits 4 is formed in the semiconductor substrate 2. One integrated circuit 4 is formed in the semiconductor chip, and the plurality of integrated circuits 4 are formed in the semiconductor wafer. A plurality of electrodes (for example, pads) 6 electrically connected to the integrated circuit 4 are formed in the semiconductor substrate 2. The electrode 6 is formed of aluminum, for example.

The semiconductor device concerning the embodiment has a resin layer 8. The resin layer 8 is formed in the face, in which the electrode 6 of the semiconductor substrate 2 is formed, as to avoid the electrode 6. The resin layer 8 may have a stress release function. The resin layer 8 can be formed of resin, such as a polyimide resin, a silicone modified polyimide resin, an epoxy resin, a silicone modified epoxy resin, benzocyclobutene (BCB), or polybenzoxazole (PBO).

The semiconductor device concerning the embodiment has one or a plurality of wiring 10. The wiring 10 is electrically connected to one electrode 6 or one group of electrodes 6. The wiring 10 may cover the whole of the exposed surfaces of the electrode 6. The wring 10 is formed as to reach the upper face of the resin layer 8 from the electrode 6. The wiring 10 has a land 14 including a protruding portion 12 projecting from the surrounding face. The protruding portion 12 may project from the face opposite to the face facing to the semiconductor substrate 2 of the wiring 10. The protruding portion 12 may project upwards (in other words, in the direction opposite to the direction in which the semiconductor substrate 2 exists, on the basis of the wiring 10). The wiring 10 may be formed of material (for example, Cu) which will not corrode as compared with the material (for example, aluminum) forming the electrode 6. Thus, it is possible to prevent the corrosion of the electrode 6, thereby preventing the electric failures.

The semiconductor device concerning the embodiment has a solder-resist layer 16. The solder-resist layer 16 covers at least a part of the wiring 10. The solder-resist layer 16 may be formed as to be put on the edge of the land 14 of the wiring 10. The solder-resist layer 16 may be formed so as not to be put on the edge of the land 14 of the wiring 10. It is possible to prevent the oxidization and corrosion of the wiring 10 by covering, with the solder-resist layer 16, the portion in which the solders 20 of the wiring 10 is provided and all the portions except for the portion being in contact with the semiconductor substrate 2, the electrode 6, and the resin layer 8, thereby preventing the electric failures.

The semiconductor device concerning the embodiment has the plurality of solders 20. The solders 20 are electrically connected to the wiring 10. The solders 20 are formed on the protruding portion 12 of the land 14 of the wiring 10, and is supported by the resin layer 8. The solders 20 are a metal (for example, alloy) having electrical conductivity, and is the one (for example, solder) to be melted to make the electric coupling. The solders 20 may be formed of either soft solder or hard solder. The solders 20 may be spherical. The upper face portion 22 of the protruding portion 12 of the land 14 is melt-eroded (intermetallic compound is formed) by the solders 20 and the material of the protruding portion 12. At this time, the thickness of the portion of the land 14 in which the intermetallic compound is not formed may be equal to or thicker than the thickness of the wiring on the resin layer.

The semiconductor device concerning the embodiment is configured as described above, and hereinafter a method of manufacturing the same will be described.

Figure 2A:
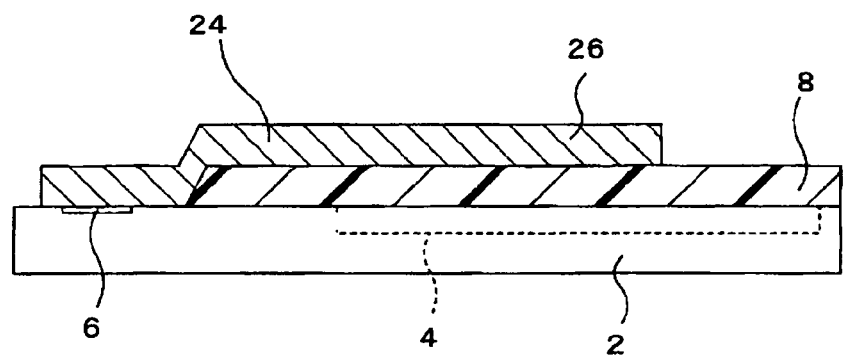
FIG. 2 shows sectional views illustrating a method of manufacturing the semiconductor device concerning the embodiment of the invention.

FIG. 2 and FIG. 3 are sectional views illustrating the method of manufacturing a semiconductor device concerning the embodiment of the invention. In the embodiment, as shown in FIG. 2(A), the electrode 6 electrically connected to the integrated circuit 4 of the semiconductor substrate 2 is formed. First, the resin layer 8 is formed in the face in which the electrode 6 of the semiconductor substrate 2 is formed, as to avoid the electrode 6. The process of forming the resin layer 8 may also include the steps of: applying a resin precursor (for example, thermosetting resin precursor) to the semiconductor substrate 2, or extending the resin precursor on the semiconductor substrate 2 by spin-coating and forming the resin precursor layer. A continuous or integral resin precursor layer may be formed using the radiation-sensitive resin precursor having properties sensitive to the radiation (light beams (ultraviolet rays, visible rays), X-rays, electron beams), and this may be patterned into the resin layer 8. Lithography is applied in the patterning. Or the resin layer 8 may be formed by printing (for example, screen printing). The resin layer 8 may be formed as to become a plurality of layers, or may be formed as to be one layer.

Next, a wiring layer 24 is formed as to be electrically connected to the electrode 6. The wiring layer 24 is formed as to reach the resin layer 8. The wiring layer 24 is formed as to be routed above the electrode 6. The thickness of the wiring layer 24 may be formed thicker than 1 μm. The wiring layer 24 is formed as to have a land 26 (a portion with the width wider than the line). The land 26 is used for providing solder thereon. After having deposited a Cu-sputtered film, for example, by sputtering, a plating resist film is formed. Then, an opening corresponding to the wiring is formed in the plating resist film using a photo lithography technique, and by carrying out electrolytic-copper plating through this opening a Cu plating wiring layer is formed. Then, the plating resist film is removed, and the Cu sputter film is etched using the Cu plating wiring layer as a mask, so that the Cu-sputtered wiring layer can be formed to form the wiring layer 24.

Figure 2B:
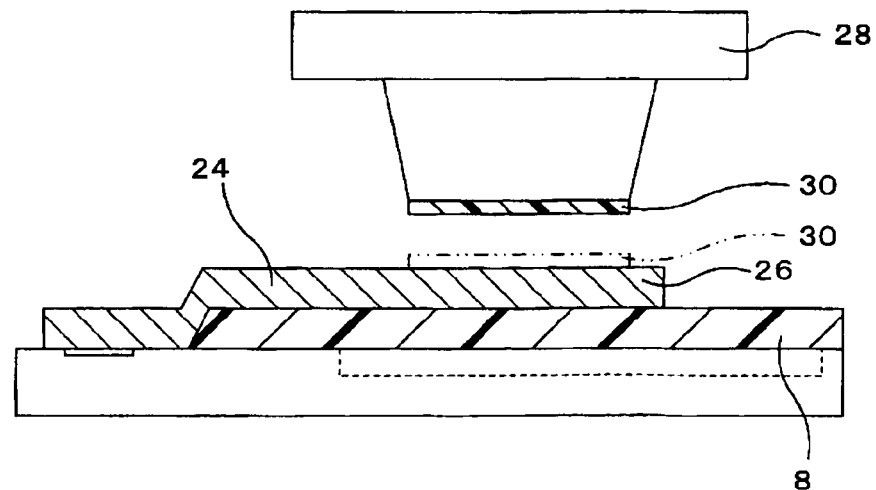

Next, as shown in FIG. 2(B), a resist 30, whose area is smaller than the area of the land 26, is transferred onto the land 26 of the wiring layer 24 on the resin layer 8 by using a transferring pin 28, so as not to be put on the edge of the land 26.

Figure 3A:
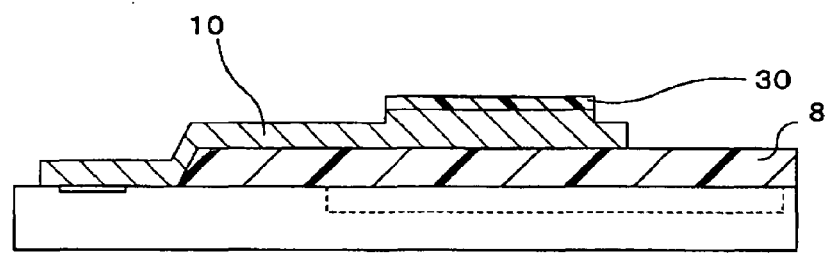
FIG. 3 shows sectional views illustrating the method of manufacturing the semiconductor device concerning the embodiment of the invention.

Next, as shown in FIG. 3(A), the wiring layer 24 is etched using the resist 30 as a mask, thereby forming the wiring 10 having a protruding portion on the resin layer 8. In this case, the protruding portion 12 projecting from the surrounding surface by 1-3 μm may be formed by etching the wiring layer 24 by 1-3 μm.

Figure 3B:
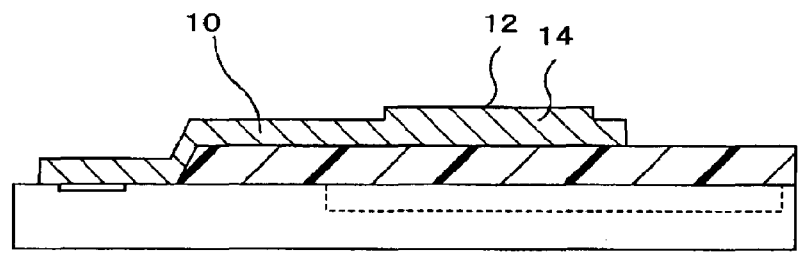

Next, as shown in FIG. 3(B), the resist 30 is removed to form a land 14 including the protruding portion 12 projecting from the surrounding face in the wiring 10.

Figure 3C:
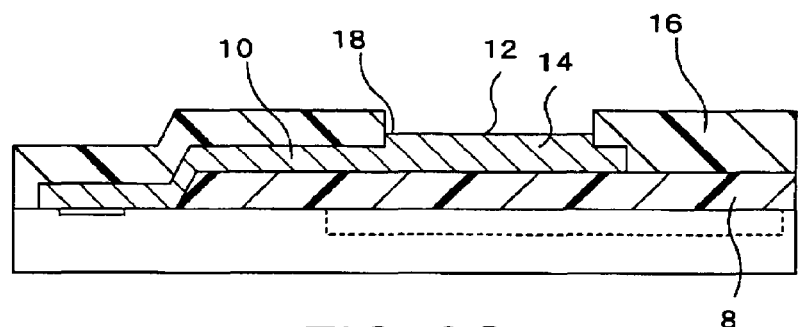

Next, as shown in FIG. 3(C), the solder-resist layer 16 is formed on the resin layer 8. The solder-resist layer 16 is formed as to cover the edge of the land 14 of the wiring 10, and so as not to be put on the edge 18 of the protruding portion 12 of the land 14.

Figure 3D:
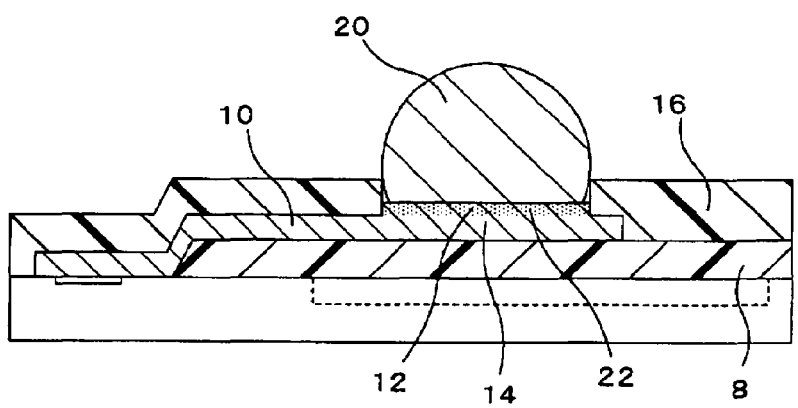

Next, as shown in FIG. 3(D), the solders 20 is formed on the protruding portion 12 of the land 14 of the wiring 10 as to be supported by the resin layer 8. In the upper face portion 22 of the protruding portion 12, the intermetallic compound is formed of the material of the solders 20. Generally, when melting solder after arranging solder on a metal wiring, the intermetallic compound is formed of the solder and the metal of the metal wiring in the junction of the solder and the metal wiring.

According to the embodiment, since the thickness of the protruding portion 12 of the land 14 of the wiring 10 is made thicker than the thickness of other than the protruding portion 12 of the land 14 of the wiring 10, it is possible to reduce disconnection of the wiring 10 remarkably even if a stress concentrates on the portion in which the intermetallic compound is formed, and thus semiconductor devices whose reliability in the electrical connection is improved and the method of manufacturing the same can be provided.

The invention is not restricted to the above-described embodiment, and various modifications can be made. For example, the invention includes substantially the same configurations (for example, configurations having the same function, method and results, or configurations having the same objective and results) as the configuration described in the embodiment. Moreover, the invention includes configurations that replace the non-essential portions in the configuration described in the embodiment. Moreover, the invention includes configurations attaining the same operational effect as that of the configuration described in the embodiment, or configurations which can attain the same objective. Moreover, the invention includes configurations which add the known arts to the configuration described in the embodiment. Furthermore, the invention includes the contents limitedly excluding any of the technical matters described in the embodiment. Or the invention includes the contents limitedly excluding the known arts from the above-described embodiment.

What is claimed is:

1. A semiconductor device, comprising:
    a semiconductor substrate in which an integrated circuit is formed, the semiconductor substrate having an electrode electrically connected to the integrated circuit
    a resin layer formed on a face in which the electrode of the semiconductor substrate is formed, as to avoid at least a part of the electrode;
    a wiring formed as to have a first portion and a second portion on the resin layer, the wiring being electrically connected to the electrode, a thickness of the second portion of the wiring being greater than a thickness of the first portion of the wiring; and
    a solder formed on the second portion of the wiring,
    wherein an upper face portion of the second portion is melt-eroded by the solder and the material of the second portion to form an intermetallic compound at a junction of the solder and the upper face portion of the second portion.

2. The semiconductor device according to claim 1, further comprising a solder-resist layer formed as to cover a part of the wiring, wherein the solder-resist layer is not put on the edge of the protruding portion.

3. A method for manufacturing semiconductor devices, comprising the steps of:

forming a resin layer on a face in which an electrode is formed, the electrode being electrically connected to an integrated circuit of a semiconductor substrate having the integrated circuit, as to avoid at least a part of the electrode;
    forming a wiring having a first portion and a second portion, the wiring being electrically connected to the electrode, a thickness of the second portion of the wiring being greater than a thickness of the first portion of the wiring;
    forming a solder-resist layer as to cover at least a part of the wiring and as not to be put on the edge of the second portion; and
    thereafter forming a solder on the second portion as to be supported by the resin layer, wherein an upper face portion of the second portion is melt-eroded by the solder and the material of the second portion to form an intermetallic compound at a junction of the solder and the upper face portion of the second portion.

4. The semiconductor device according to claim 1, wherein the wiring is formed to have a third portion that is not melt-eroded by the solder and the material of the second portion, wherein a thickness of the third portion is greater than or equal to the thickness of the first portion of the wiring and wherein the third portion is disposed under the upper face portion of the second portion.

* * * * *